United States Patent
Carmi et al.

(10) Patent No.: US 7,448,125 B2
(45) Date of Patent: Nov. 11, 2008

(54) METHOD OF PRODUCING RFID IDENTIFICATION LABEL

(75) Inventors: Yoash Carmi, Kibbutz Eilon (IL); Dany Eisenstadt, Kefar Veradim (IL)

(73) Assignee: Hanita Coatings R.C.A. Ltd, Kibbutz Hanita (IL)

( * ) Notice: Subject to any disclaimer, the term of this patent is extended or adjusted under 35 U.S.C. 154(b) by 164 days.

(21) Appl. No.: 11/358,298

(22) Filed: Feb. 22, 2006

(65) Prior Publication Data

US 2006/0187056 A1 Aug. 24, 2006

Related U.S. Application Data

(60) Provisional application No. 60/654,506, filed on Feb. 22, 2005.

(51) Int. Cl.
*H01Q 13/00* (2006.01)
(52) U.S. Cl. .............. 29/600; 29/825; 29/601; 343/867; 340/572.8; 156/256
(58) Field of Classification Search ............ 29/600, 29/601, 832, 825, 874, 592.1; 343/700 MS, 343/867; 340/572.8, 572.7; 156/291, 292, 156/256, 277
See application file for complete search history.

(56) References Cited

U.S. PATENT DOCUMENTS

| | | | |
|---|---|---|---|
| 4,822,451 A | 4/1989 | Ouderkirk et al. | |
| 4,879,176 A | 11/1989 | Ouderkirk et al. | |
| 5,286,550 A | 2/1994 | Yu et al. | |
| 5,389,195 A | 2/1995 | Ouderkirk et al. | |
| 6,100,804 A * | 8/2000 | Brady et al. | 340/572.7 |
| 6,259,369 B1 * | 7/2001 | Monico | 340/572.8 |
| 7,260,882 B2 * | 8/2007 | Credelle et al. | 29/600 |
| 2006/0187056 A1 * | 8/2006 | Carmi et al. | 340/572.7 |

OTHER PUBLICATIONS

"Adhesion Promotion Technique for Coatings on PET, PEN and PI", D.J. McClure, D.S. Dunn and A.J. Ouderkirk, 3M Company, St. Paul, MN. 2000 Society of Vacuum Coaters; 505/856-7188, pp. 342-346.
"A Low-Cost Flexible Circuit on a Polyester Substrate", D.J. McClure, D.S. Dunn, G.M. Jellum and A.J. Ouderkirk, 3M Corporate Process Technology Center, St. Paul, MN., 1999 Society of Vacuum Coaters, 505/856-7188, pp. 445-447.

* cited by examiner

*Primary Examiner*—Minh Trinh
(74) *Attorney, Agent, or Firm*—Pearl Cohen Zedek Latzer, LLP

(57) ABSTRACT

According to embodiments of the present invention, a method for manufacturing an array of radio frequency identification (RFID) antennas is provided. The method comprises applying an anti-sticking agent onto selective areas of a substrate. These areas are substantially complementary to antenna-areas having the shape of the RFID array. Then, the process continues by depositing in a vacuum chamber a first electrically conductive layer onto said antenna-areas. The substrate is then immersed in an electrolyte solution in which the electrically conductive layer is electroplated to form a metal layer having a desired thickness.

19 Claims, 3 Drawing Sheets

METHOD OF PRODUCING RFID IDENTIFICATION LABEL

CROSS REFERENCE TO RELATED APPLICATIONS

The present invention claims benefit of U.S. provisional application 60/654,506, filed Feb. 22, 2005.

BACKGROUND OF THE INVENTION

RFID (Radio Frequency Identification) labels may be used, among other applications, as a replacement for bar codes. An important advantage of such RFID labels is that they enable remote reading of information from objects that are out of sight. Each label contains an antenna, which may read the radio frequency and may transfer the information and RF tag, which is electronically programmed with unique information to be transmitted. The thickness of the antenna is a major factor for ensuring satisfactory performance. A typical antenna may have a thickness of approximately 3-7 microns to enable acceptable performance. Additionally, the antenna should have a precise shape according to a pre-designed pattern.

RFID labels are categorized as either active or passive. Passive RFID labels operate without a separate external power source and obtain operating power generated from a central reader. Active RFID labels are powered by an internal battery and may be programmable. An important issue for the RFID industry is reducing the price of the labels, especially for passive RFID labels at the item level. Passive RFID labels are consequently much lighter than active tags, less expensive but they have shorter read ranges and require higher-powered readers.

A conventional method of producing antennas for RFID labels is to chemically etch copper or aluminum foils laminated to polyester (PET) films. The thickness of a standard copper film is between 18 microns and 35 microns and accordingly, this process is, very expensive, slow and not environmentally safe. Another technology is to print out the antenna patterns with conductive ink based on pastes containing a high concentration of electrically conductive particles (mainly silver). This process is also expensive. The low electrical conductivity of the inks is another drawback.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
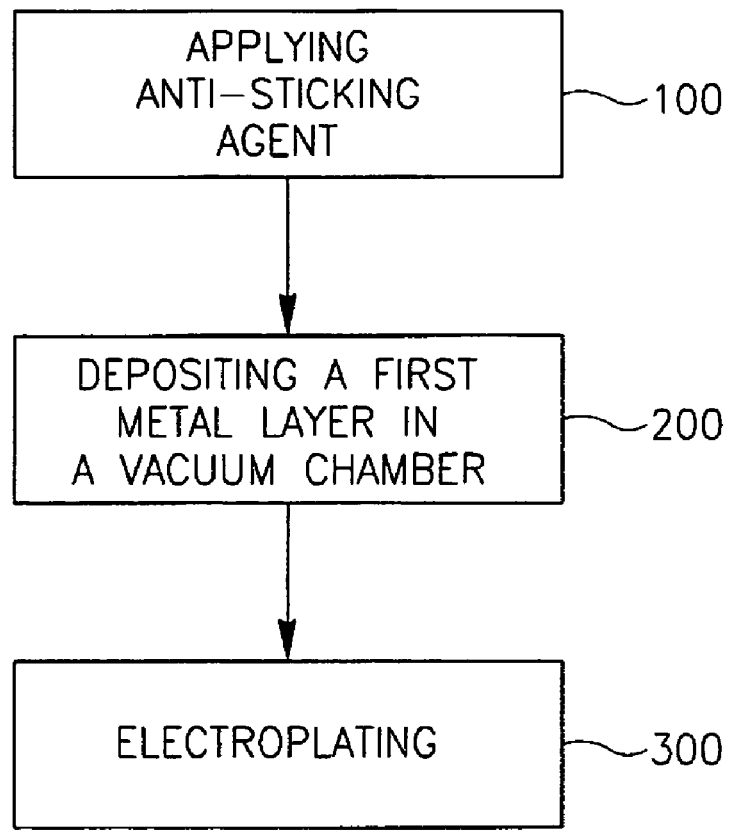
FIG. 1 is a flowchart illustration of a method for manufacturing an array of RFID antennas according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the embodiments of present invention may be practiced without these specific details. In other instances, well-known methods, procedures and components have not been described in detail so as not to obscure the present invention.

Embodiments of the present invention are directed to a method of producing an array of electrically conductive objects on a substrate. According to some embodiments of the present invention, the conductive objects may be antennas for Radio Frequency identification (RFID) labels. According to some embodiments, the method may comprise applying an anti-sticking agent onto selective areas of a substrate that are substantially complementary to areas on which RFID antennas are to be placed.

Then, in a vacuum chamber, depositing an electrically conductive layer, such as a metal layer onto the areas of the substrate that are not coated with the anti-sticking agent. The substrate is then immersed in an electrolyte solution for electroplating the electrically conductive layer to form a metal layer having a desired thickness. According to some embodiments of the present invention, the antenna may have a thickness between 0.3 micron and 40 microns. According to other embodiments of the present invention the antennas may have a thickness of between 2 microns and 7 microns.

Although, in the description below, exemplary embodiments of methods of producing an array of RFID antennas are given, it should be understood to a person skilled in the art that embodiments of the present invention may be used in a variety of other applications. According to other embodiments of the present invention, the methods described in relation to RFID antennas may be used for the manufacturing of conductive objects related to flexible electronics. Non-limiting examples of such objects may be heaters, membranes, switches, flexible printed circuit boards, conductive panels and the like.

According to these embodiments, the method may comprise applying an anti-sticking agent onto selective areas of a substrate that are substantially complementary to areas on which conductive objects are to be placed. Then, in a vacuum chamber, depositing a first metal layer or another electrically conductive layer onto the areas on which the conductive objects are to be placed. The substrate is then immersed in an electrolyte solution for electroplating on top of the first metal layer to form a second metal layer having a desired thickness.

Figure 2A:
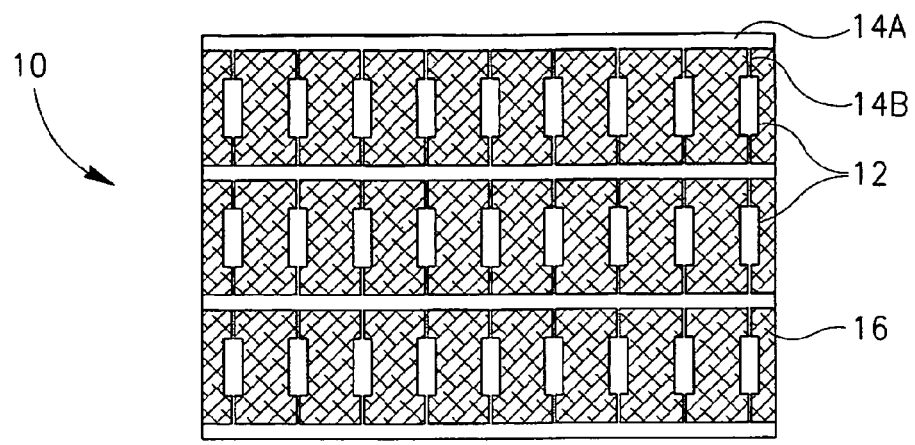
FIGS. 2A-2C are pictorial illustrations showing the manufacturing process of an exemplary array of RFID antennas according to embodiments of the present invention.
Figure 2B:
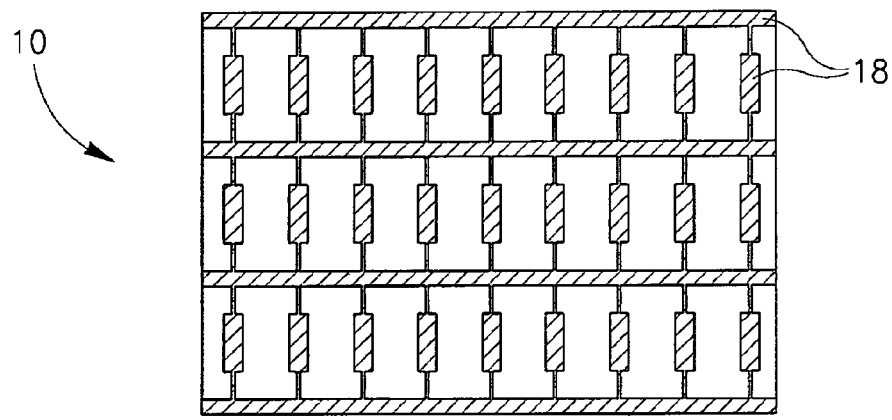
Figure 2C:
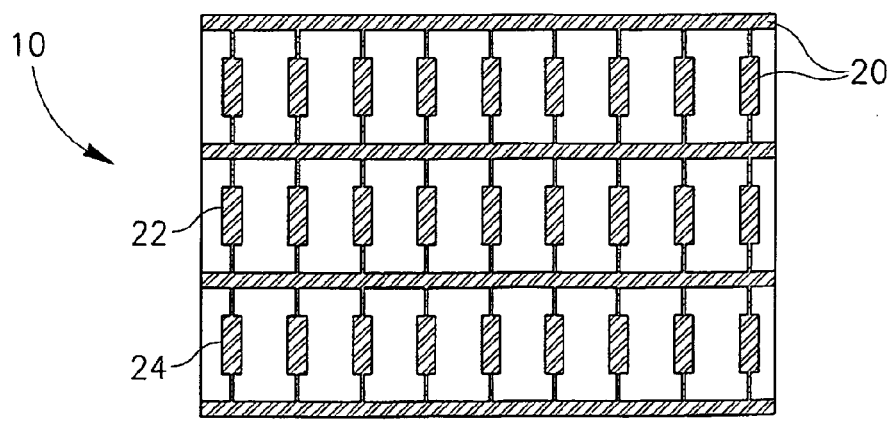

Reference is now made to FIG. 1, which is a flowchart diagram demonstrating a method for manufacturing an array of RFID antennas according to embodiments of the present invention. Reference is additionally made to FIGS. 2A-2C, which are pictorial illustrations showing the manufacturing process of an exemplary array of RFID antennas on a substrate according to embodiments of the present invention. As shown in FIG. 2A, a substrate 10 from which RFID labels can be produced is provided. Substrate 10 may be continuously wound in a form of a roll. Alternatively, sheets of substrate material may be used in the manufacturing process. The substrate may be a polymeric substrate such as, for example, a polyester (PET) film, a polypropylene (PP) film, a polyethylene (PE) film, polyimide (PI) film, polyethylenenaphtalate (PEN) film, polycarbonate (PC) substrate and PVC substrate. Alternatively, the substrate may be from other materials such as, for example treated cardboard or treated paper.

Throughout the specification and the claims the terms relating to different areas on a surface of substrate 10 are defined as follows: The term "antenna-areas" refers to areas on the surface of substrate 10 on which RFID antennas are placed on the substrate in the manufacturing process. With reference to FIG. 2A, areas designated by numeral 12 are antenna-areas.

Similarly, the term "object-areas" refers to areas on the surface of substrate 10 on which electrically conductive objects are placed in the manufacturing process. It should be noted that throughout the specification, whenever the antenna-areas or RFID antennas are mentioned, equivalent description may apply to object-areas and conductive objects.

The term "connecting areas" refers to areas on the surface of substrate 10 on which connecting metal stripes or lines to connect between the antenna-areas or the object-areas. With reference to FIG. 2A, areas designated by numeral 14A and 14B are connecting areas. The term "complementary areas" refers to the remaining areas on the surface of the substrate onto which an anti-sticking agent is applied during the manufacturing process. With reference to FIG. 2A, areas designated by numeral 16 are complementary areas.

The process of applying the anti-sticking agent is now described with reference to box 100 of FIG. 1. As stated above, the array of RFID antennas may be assembled using a roll-to-roll process. In these embodiments, a roll of substrate material 10 may be unwound using a substrate-feed roller for printing (selectively coating) the anti-sticking agent on selective areas of the substrate (complementary areas). According to other embodiments of the present invention, the substrate-feed roller may be replaced by a sheet feeder mechanism and substrate 10 may be then in a form of substrate sheets.

Optionally, the printing process may take place in a vacuum chamber followed in-line by the next operation as explained in details hereinbelow.

The pattern of the RFID array, namely the shape of the antennas and the distance between them, is pre-designed according to the desired pitch of the RFID labels and their specific use. The pre-designed pattern of the complementary areas is designed such that areas associated with the antennas and the connecting stripes will not be coated during the printing process of the anti-sticking agent on substrate 10. According to the pre-determined pattern of the complementary areas, substrate 10 is selectively coated with a thin layer of an anti-sticking agent. The term "anti-sticking agent" as used herein refers to materials that may prevent, in a vacuum deposition process, the accumulation of a metallic layer on areas covered by the anti-sticking agent.

The anti-sticking agent may be an oily material having a low vapor pressure below $3*10^{-3}$ Torr at 25° C. For example, perfluoropolyether (PFPE) oils having a vapor pressure below $2*10^{-3}$ Torr at 25° C. may be used. Other materials which may be applicable as an anti-sticking agent as defined hereinabove may be oils, waxes, polyolefins and Teflon-like coatings. Alternatively, substrate 10 may be coated with other anti-sticking agents, such as waxes, for example, paraffin.

The process of selectively coating substrate 10 may be performed in various methods, such as flexography printing, gravure printing, screen printing, inkjet printing and other applicable methods which may be used in a vacuum or an atmospheric environment.

According to some embodiments of the present invention, the selective coating is performed inside a vacuum metal-deposition chamber using flexography printing. In these embodiments, the relief on the flexography roll in substantially identical to the complementary areas and the engraved portions correspond to the antenna areas and the connecting areas.

As shown in the exemplary illustration of FIG. 2A, connecting areas 14 may comprise wider stripes 14A, which correspond to respective channels on the flexography roll, substantially parallel to the edges of the substrate. In addition, connecting areas 14 may comprise narrower stripes 14B, which correspond to respective channels on the flexography roll, substantially perpendicular to wider stripes 14A and connecting antenna-areas 12 to wider stripes 14A.

Although a specific exemplary relief pattern of connecting areas, which enable the process of electroplating, is described, it should be understood to a person skilled to the art that it does not limit the embodiments of the present invention in this respect and the connections areas may be at any shape or size suitable for the electroplating process.

Although twenty seven antennas arranged in three rows are shown in FIGS. 2A-2C, it should be understood to a person skilled in the art that the scope of the present invention is not limited in this respect and any other RFID antenna array may be manufactured using the method according to embodiments of the present invention.

According to some embodiments, in the flexography process, a first roll is immersed in a container of anti-sticking agent. The coated roll is then pressed against a flexo roll having a pre-designed relief pattern thereon such that the anti-sticking agent is transferred onto the pattern of the flexo roll. Then, the flexo roll may be pressed against substrate 10 to selectively transfer the anti-sticking agent onto the substrate while leaving the antenna-areas and the connecting areas uncoated.

According to other embodiments, a bath with anti-sticking agent may be heated up. Then, a smooth roll may rotate above the bath such that the vapor of the anti-sticking agent is condensed onto the surface of the roll. The coated roll is then pressed against a flexo roll having a redesigned relief pattern, as described above and the flexo roll is then pressed against substrate 10 to selectively transfer the anti-sticking agent onto substrate 10. According to these embodiments, the amount of the anti-sticking agent applied to substrate 10 may be controlled by controlling the temperature of the anti-sticking agent in the bath.

The coated portion of the substrate may be transferred immediately in-line for further processing, namely, coating the antenna-areas and connecting areas with an electrically conductive layer, such as a metal layer. As mentioned, the selective coating method is not limited to flexography printing or to vacuum conditions and the anti-sticking agent may be applied onto the substrate by other processes performed in atmospheric conditions or inside a vacuum chamber.

The process of depositing an electrically conductive layer onto the antenna-areas and the connecting areas is now described with reference to box 200 of FIG. 1.

According to some embodiments of the present invention, the selective in-vacuum metallization process is performed by resistive vapor vacuum metallization. Alternatively, according to other embodiments of the present invention, the selective in-vacuum metallization process may be performed by inductive vacuum metallization sputtering, electron beam gun or any other applicable physical vacuum deposition technique as known in the art.

In the vapor vacuum metallization process, substrate 10 selectively coated with anti-sticking agent as described above, may run through a cloud of metallic vapor produced by continuous introduction of metallic wires to the surface of heated evaporation boats. It should be noted that this process has been used for the manufacturing of capacitors and for the manufacturing of special packaging to heat food in a microwave oven. The metallic substance used for this process may be copper, aluminum, nickel, silver, stainless steel and others, various metallic alloys, for example, bronze and brass or any combination of co-deposited metals.

According to other embodiments of the present invention, instead of metallic wires, other electrically conductive materials may be used. Non-limiting examples of some materials may be indium-oxide and indium-tin oxide. Although, in the description below, in the exemplary embodiments of methods of producing an array of RFID antennas depositing a metal layer is described for clarity and simplification, it should be understood to a person skilled in the art that embodiments of the present invention may use other depositions such as indium oxide deposition and others. Accordingly, it should be noted that throughout the specification, whenever the terms "a first metal layer" or "metal deposition" are mentioned, equivalent description may apply to "an electrically conductive layer" or "electrically conductive material deposition".

When the hot metallic vapor meets the surface of substrate 10, a thin metal layer 18 is deposited onto antenna-areas 12 and connecting areas 14. During the vapor deposition process, the anti-sticking agent coated on to the complementary areas 16 may inhibit the metallic atoms or group of atoms from sticking to substrate 10. Furthermore, during the vapor deposition process, the anti-sticking agent may be heated up by the hot metallic vapor and may evaporate from complementary areas 16 of substrate 10. These processes may locally prevent the accumulation of the metallic particles on the complementary areas 16.

The intermediate product produced by the process described above is illustrated by FIG. 2B. Substrate 10 is selectively coated with a first metal layer 18 having a desired pattern such that only antenna-areas 12 and connecting areas 14 are covered with metal and complementary areas 16 are left uncoated. It should be understood to a person skilled in the art that during the metal deposition process the deposited substrate may be rewound to form a roll of a metallic patterned substrate.

The thickness of the patterned first metal layer is typically 0.1 micron, although it may vary between 1 nanometer and 2 micron. For example, the final desired thickness in order to achieve an acceptable performance of RFID antennas for UHF applications may be approximately 5 microns. The desired thickness for other applications may vary between 0.3 micron and 40 micron. Accordingly, the substrate should be further processed to achieve the desired thickness.

According to embodiments of the present invention the desired thickness of the antennas may be achieved by electroplating. The first metal layer, which serves as a seeding layer, may be electroplated with a different or identical metal by a standard electro-deposition process. The electro-deposition may increase the thickness of the patterned metal layer to the desired thickness with minor effects on the required shape of the antennas. Electroplating is often also called electro-deposition, and the two terms are used interchangeably.

The process of electroplating the first metal layer is now described with reference to box 300 of FIG. 1.

Electrodeposition is the process of producing a metallic coating on a surface by the action of electric current. In the electro-deposition process, according to some embodiments of the present invention, the film is unwound and is immersed into an electrolyte solution, such as sulphuric acid ($H_2SO_4$). First metal layer 18 on substrate 10 is connected to an electrical circuit as the cathode and a metallic anode may release metal ions to the solution. Alternatively, the metal ions, such as, copper ions may reach the solution from dissolving electrolytes (metal salts) into the solution. As described herein above, the pattern of the first metal layer is designed to ensure that each antenna 24 is electrically connected to the electrical circuit at least during a portion of the electroplating process.

When an electrical current is passed through the circuit, the metal ions in the solution, such as copper ions ($Cu^{++}$), are attracted to first metal layer 18 and are deposited on it in an evenly manner to form a second metal layer 20. Although for the purpose of the present example, copper is used as the coating metal, it should be understood to a person skilled in the art that the scope of the present invention is not limited in this respect and other metals such as aluminum, nickel, silver, chromium and others may be used. It should be understood that metal alloy or combination of metal ions may be used as well.

It should be understood to a person skilled in the art that the first and second metal layers may contain the same metal and may blend to form a single active layer. Alternatively, first metal and second metal layer may comprise different metals or alloys and accordingly may be distinguishable.

The electroplating process may be controlled such that the thickness of the electroplated pattern would be as desired, without changing the exact shape of the antennas. According to other embodiments of the present invention, changes in the shape of the antennas may occur. FIG. 2C shows the array of RFID antennas. The array may comprise a plurality of antennas 22 and connecting stripes 24 attached to antennas 22. Optionally, a further processing operation may be disconnecting connecting wires 24 from antennas 22 so as not to affect the performance of the antenna Alternatively, connecting stripes 24 may be removed from substrate 10.

Figure 3:
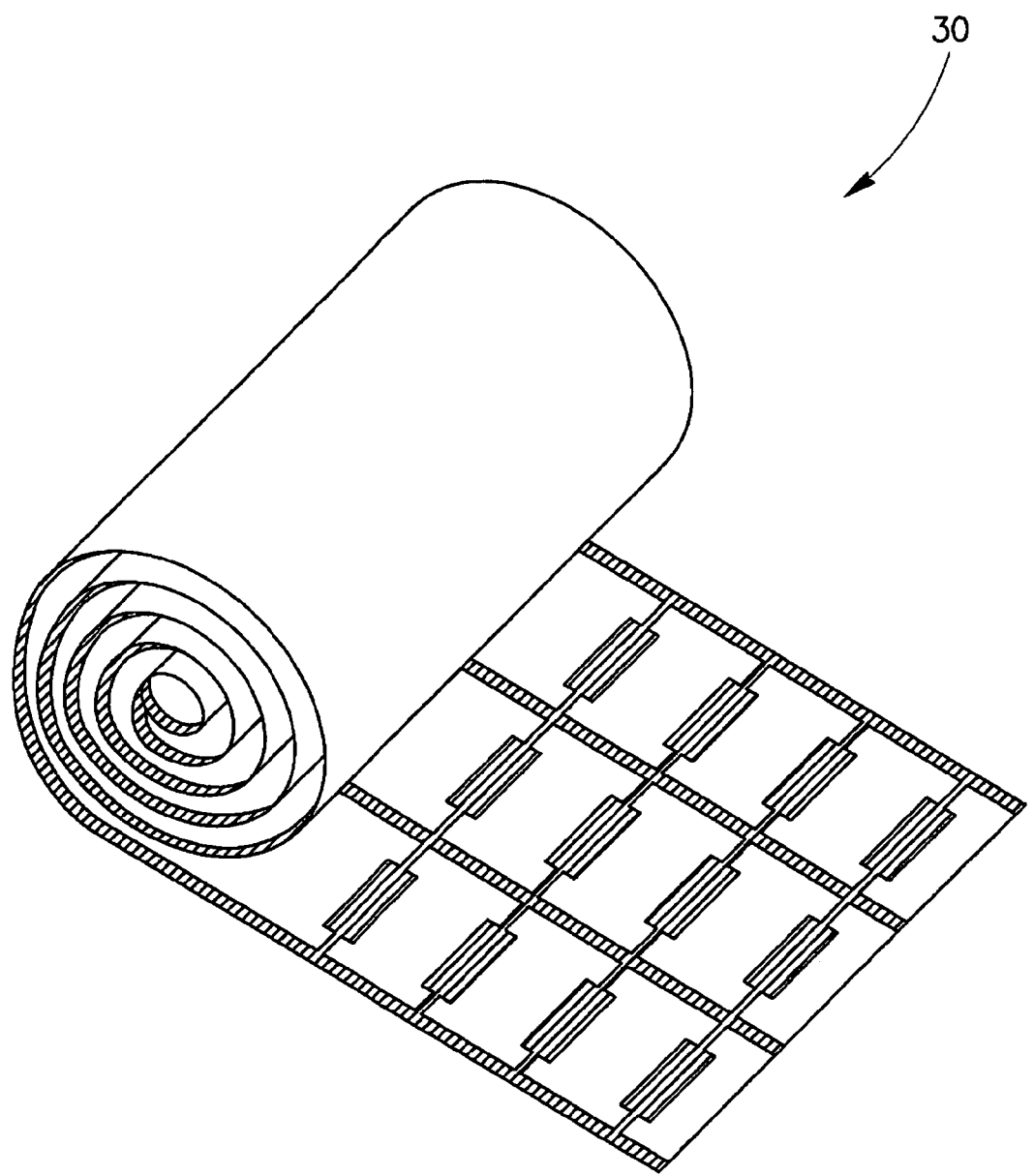
FIG. 3 is an illustration of an exemplary array of RFID antennas manufactured according to embodiments of the present invention.

An illustration of an exemplary array of RFID antennas on a roll of substrate 30 manufactured according to embodiments of the present invention is shown in FIG. 3. The roll of substrate having the array of antennas thereon may then be further processed to the final product, namely, RFID labels and tags.

It is appreciated that one or more of the steps of any of the methods described herein may be omitted or carried out in a different order than that shown, without departing from the true spirit and scope of the invention.

While the present invention has been described with reference to one or more specific embodiments, and mainly to embodiments describing the manufacturing of an array of RFID antennas, the description is intended to be illustrative of the invention as a whole, and is not to be construed as limiting the invention to the embodiments shown. As explained above, it should be understood to a person skilled in the art that embodiments of the present invention may be used for the manufacturing of conductive objects related to flexible electronics, such as, for example, heaters, membranes, switches, flexible printed circuit boards, conductive panels and the like.

It is appreciated that various modifications may occur to those skilled in the art that, while not specifically shown herein, are nevertheless within the true spirit and scope of the invention.

What is claimed is:

1. A method for manufacturing an array of radio frequency identification (RFID) antennas, the method comprising:

applying an anti-sticking agent onto selective areas of a substrate, said selective areas are substantially complementary to antenna-areas having the shape of said antennas;

in a vacuum chamber, depositing an electrically conductive layer onto said antenna-areas; and electroplating said electrically conductive layer to form a metal layer having a desired thickness.

2. The method of claim 1 comprising:

depositing said electrically conductive layer onto connecting areas to form electrically conductive connections between said antenna-areas.

3. The method of claim 1 comprising:

after achieving said desired thickness, disconnecting said electrically conductive connections from antennas deposited on said antenna-areas.

4. The method of claim 1, wherein applying said anti-sticking agent comprises applying an oily agent having a vapor pressure below 0.003 Torr at 25° C.

5. The method of claim 4, wherein applying said oily agent comprises applying perfluoropolyether (PFPE) oils.

6. The method of claim 1 wherein applying said anti-sticking agent comprises applying a wax.

7. The method of claim 1, wherein applying said anti-sticking agent comprises using flexography printing, gravure printing, screen printing or inkjet printing.

8. The method of claim 1, wherein applying said anti-sticking agent comprises applying said anti-sticking agent inside said vacuum chamber.

9. The method of claim 1, wherein depositing said electrically conductive layer comprises using resistive vacuum metallization, inductive vacuum metallization sputtering or electron beam gun deposition.

10. The method of claim 1, wherein depositing said electrically conductive layer comprises depositing copper, aluminum, nickel, silver, stainless steel, indium oxide, indium-tin oxide, metallic alloy deposition or co-deposition of metals or metallic alloys.

11. The method of claim 1, wherein electroplating comprises depositing copper, aluminum, nickel, silver, chromium, brass, bronze or a combination thereof.

12. The method of claim 1, wherein applying the anti-sticking agent onto selective areas of said substrate comprises applying the anti-sticking agent onto selective areas of a polymeric substrate or treated paper.

13. The method of claim 12, wherein said polymeric substrate comprises polyester (PET), polypropylene (PP), polyethylene (PE), polyimide (PI), polyethylenenaphtalate (PEN), polycarbonate (PC) or PVC.

14. The method of claim 1, wherein said substrate is in a form of roll.

15. The method of claim 1, wherein said electrically conductive layer and said metal layer comprise different materials.

16. The method of claim 1, wherein said metal layer has a thickness of between 0.3 and 40 micron.

17. A method for manufacturing an array of conductive objects, the method comprising:

applying an anti-sticking agent onto selective areas of a substrate, said selective areas are substantially complementary to object-areas having the shape of said objects;

in a vacuum chamber, depositing an electrically conductive layer onto said object-areas; and electroplating said electrically conductive layer to form a metal layer having a desired thickness.

18. The method of claim 17, wherein depositing said electrically conductive layer onto said object-areas comprises depositing said electrically conductive layer on areas substantially having a shape of a conductive heater, a switch, a flexible printed circuit board or a conductive panel.

19. The method of claim 17 comprising:

depositing said electrically conductive layer onto connecting areas to form electrically conductive connections between said object-areas.

* * * * *